United States Patent
Kim

(10) Patent No.: US 11,444,052 B2
(45) Date of Patent: Sep. 13, 2022

(54) SEMICONDUCTOR PACKAGE INCLUDING A PACKAGE SUBSTRATE INCLUDING STAGGERED BOND FINGERS

(71) Applicant: SK hynix Inc., Icheon-si (KR)

(72) Inventor: Jong Hui Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/031,200

(22) Filed: Sep. 24, 2020

(65) Prior Publication Data

US 2021/0327845 A1    Oct. 21, 2021

(30) Foreign Application Priority Data

Apr. 20, 2020 (KR) .......... 10-2020-0047748

(51) Int. Cl.
*H01L 23/00* (2006.01)
*H01L 25/065* (2006.01)
*H01L 23/498* (2006.01)

(52) U.S. Cl.
CPC ........ *H01L 24/49* (2013.01); *H01L 23/49838* (2013.01); *H01L 24/06* (2013.01); *H01L 24/48* (2013.01); *H01L 24/73* (2013.01); *H01L 25/0655* (2013.01); *H01L 2224/06155* (2013.01); *H01L 2224/48106* (2013.01); *H01L 2224/48227* (2013.01); *H01L 2224/49175* (2013.01); *H01L 2224/73265* (2013.01)

(58) Field of Classification Search
CPC ......... H01L 24/49; H01L 24/06; H01L 24/48; H01L 24/73; H01L 23/49838; H01L 25/0655

See application file for complete search history.

(56) References Cited

U.S. PATENT DOCUMENTS

| 6,278,616 | B1 * | 8/2001 | Gelsomini | .............. H01L 24/49 438/109 |
| 8,754,518 | B1 | 6/2014 | Carpenter et al. | |
| 2001/0030897 | A1 * | 10/2001 | King | .................... G11C 29/808 365/200 |

* cited by examiner

*Primary Examiner* — Marc Anthony Armand
(74) *Attorney, Agent, or Firm* — William Park & Associates Ltd.

(57) ABSTRACT

A semiconductor package includes a package substrate including: first and second bond finger arrays, each of the first and second finger arrays arranged in a first direction on a surface of the package substrate; a first semiconductor chip disposed on the surface of the package substrate and including a first chip pad array corresponding to the first bond finger array; a second semiconductor chip disposed on the surface of the package substrate and including a second chip pad array corresponding to the second bond finger array; first bonding wires connecting bond fingers of the first bond finger array to chip pads of the first chip pad array; and second bonding wires connecting bond fingers of the second bond finger array to chip pads of the second chip pad array.

18 Claims, 5 Drawing Sheets

SEMICONDUCTOR PACKAGE INCLUDING A PACKAGE SUBSTRATE INCLUDING STAGGERED BOND FINGERS

CROSS-REFERENCE TO RELATED APPLICATIONS

The present application claims priority under 35 U.S.C. 119(a) to Korean Application No. 10-2020-0047748, filed on Apr. 20, 2020, which is incorporated herein by references in its entirety.

BACKGROUND

1. Technical Field

The present disclosure generally relates to a semiconductor package and, more particularly, to a semiconductor package including a package substrate including bond fingers staggered along a direction.

2. Related Art

Typically, a semiconductor package includes a package substrate and a semiconductor chip mounted on the package substrate. The semiconductor chip may be electrically connected to the package substrate through a connection means such as bumps or bonding wires.

Recently, in response to a drive toward lighter and shorter package products, research into the structure of package substrates and semiconductor chips for effectively arranging a plurality of circuit patterns within a limited area has been conducted.

SUMMARY

A semiconductor package according to an embodiment of the present disclosure may include: a package substrate including first and second bond finger arrays, each of the first and second bond finger arrays arranged in a first direction on a surface of the package substrate; a first semiconductor chip disposed on the surface of the package substrate and including a first chip pad array corresponding to the first bond finger array; a second semiconductor chip disposed on the surface of the package substrate and including a second chip pad array corresponding to the second bond finger array; first bonding wires connecting bond fingers of the first bond finger array to chip pads of the first chip pad array; and second bonding wires connecting bond fingers of the second bond finger array to chip pads of the second chip pad array. The bond fingers of the first bond finger array and the bond fingers of the second bond finger array at least partially overlap with each other along the first direction.

A semiconductor package according to another embodiment of the present disclosure may include: a package substrate including first and second bond finger arrays that are arranged along first and second lines, respectively, in a first direction on a surface of the package substrate; a first semiconductor chip including a first chip pad array corresponding to the first bond finger array on the surface of the package substrate and disposed closer to the second bond finger array than the first bond finger array; a second semiconductor chip including a second chip pad array corresponding to the second bond finger array on the surface of the package substrate and disposed closer to the first bond finger array than the second bond finger array; first bonding wires connecting bond fingers of the first bond finger array to chip pads of the first chip pad array; second bonding wires connecting bond fingers of the second bond finger array to chip pads of the second chip pad array; first trace patterns electrically connecting the bond fingers of the first bond finger array to first wirings of the package substrate on the surface of the package substrate; and second trace patterns electrically connecting the bond fingers of the second bond finger array to second wirings of the package substrate on the surface of the package substrate. The bond fingers of the first bond finger array and the bond fingers of the second bond finger array are staggered along the first direction.

DETAILED DESCRIPTION

Figure 1:
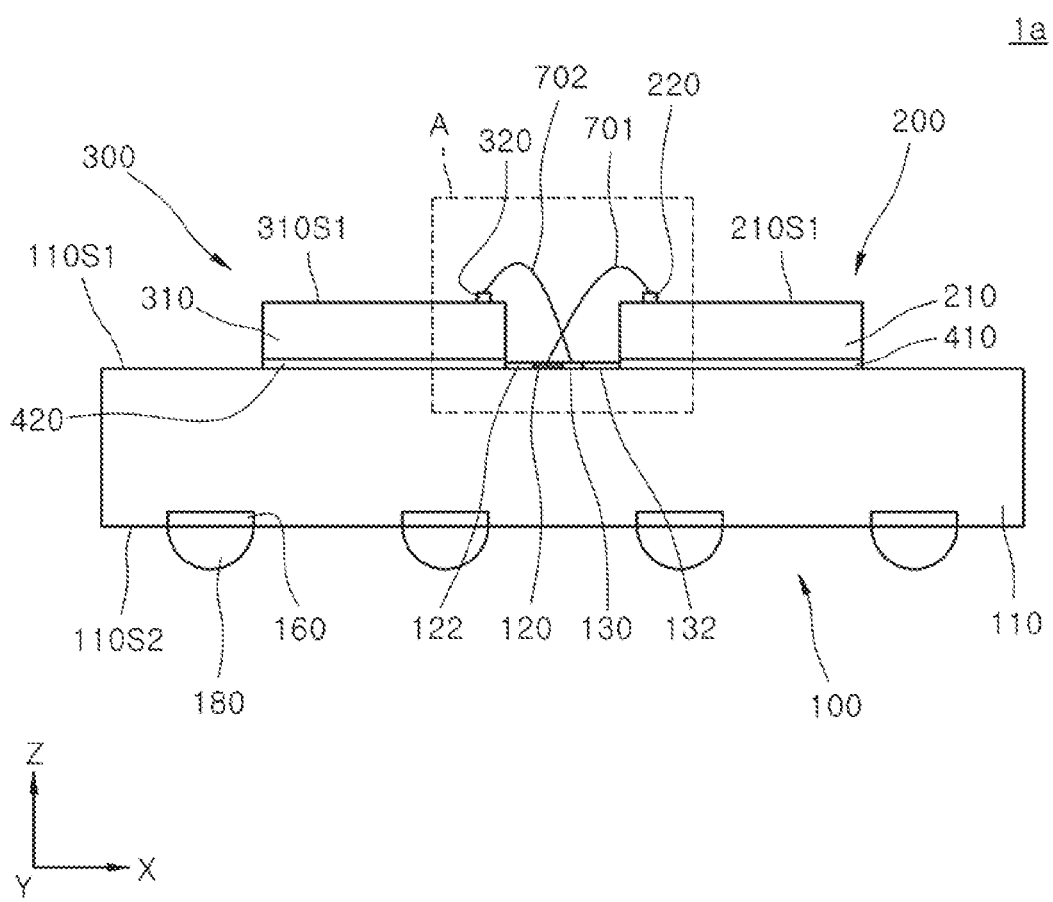
FIG. 1 is a cross-sectional view schematically illustrating a semiconductor package according to an embodiment of the present disclosure.

The terms used herein may correspond to words selected in consideration of their functions in presented embodiments, and the meanings of the terms may be construed to be different according to those of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. In the description of the embodiments of the present disclosure, descriptions such as "first" and "second," "upper" and "lower," and "left" and "right" are for distinguishing members, and are not used to limit the members themselves or to mean a specific order.

The semiconductor chips described herein may include a form in which a semiconductor substrate into which an electronic circuit is integrated is cut into a die. The semiconductor chips may correspond to memory chips, logic chips (including application-specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The logic chips may include logic circuits which are integrated on the semiconductor substrate. The semiconductor chips may be referred to as semiconductor dies according to their shape after the die sawing process.

In this specification, a semiconductor package may include a package substrate on which a semiconductor chip is mounted. The package substrate may include at least one layer of integrated circuit patterns and may be referred to as a printed circuit board (PCB) in the present specification. The semiconductor package may include a plurality of semiconductor chips stacked on the package substrate.

The semiconductor package may be employed in various communication systems such as mobile phones, electronic systems associated with biotechnology or health care, or wearable electronic systems.

Same reference numerals may refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

In this specification, a semiconductor package is illustrated using a Cartesian coordinate system with x-y-z axes being perpendicular to each other. In this case, the X-direction may mean a direction parallel to the X-axis. Similarly, the Y-direction and the Z-direction may mean a direction parallel to the Y-axis and a direction parallel to the Z-axis, respectively.

FIG. 1 is a cross-sectional view schematically illustrating a semiconductor package 1a according to an embodiment of the present disclosure. Referring to FIG. 1, the semiconductor package 1a may include a package substrate 100, a first semiconductor chip 200 disposed on the package substrate 100, and a second semiconductor chip 300 disposed to be spaced apart from the first semiconductor chip 200 in the lateral direction. The first semiconductor chip 200 and the second semiconductor chip 300 may be homogeneous chips or heterogeneous chips. The first and second semiconductor chips 200 and 300 may be electrically connected to the package substrate 100 through wire bonding, respectively.

The package substrate 100 may include a substrate body portion 110. The substrate body portion 110 may include an upper surface 110S1 and a lower surface 110S2 opposite to the upper surface 110S1, A first bond finger array 120 and a second bond finger array 130 may be disposed, respectively, in a line along a first direction (i.e., the Y-direction) between the first semiconductor chip 200 and the second semiconductor chip 300 on the upper surface 110S1 of the substrate body portion 110. That is, the first bond finger array 120 may be arranged along a first line in the Y-direction and the second bond finger array 130 may be arranged along a second line in the Y-direction on the upper surface 110S1 of the substrate body portion 110. Although not illustrated, each of the first and second bond finger arrays 120 and 130 may include a plurality of bond fingers. As described later in connection with FIGS. 2 to 4, bond fingers of the first bond finger array 120 and bond fingers of the second bond finger array 130 may be arranged to be spaced apart from each other. In addition, the bond fingers of the first bond finger array 120 and the bond fingers of the second bond finger array 130 may be staggered along the first direction (i.e., the Y-direction). Here, at least a portion of each of the bond fingers of the first bond finger array 120 and a portion of the bond fingers of the second bond finger array 130 may overlap along the first direction (i.e., the Y-direction).

Referring to FIG. 1, first and second trace patterns 122 and 132 may be disposed on the upper surface 110S1. The first trace patterns 122 may electrically connect the bond fingers of the first bond finger array 120 to first wirings (not illustrated) of the package substrate 100. Similarly, the second trace patterns 132 may electrically connect the bond fingers of the second bond finger array 130 to second wirings (not illustrated) of the package substrate 100. The first and second trace patterns 122 and 132 may extend to the lower portions of the first and second semiconductor chips 200 and 300, respectively on the upper surface 110S1 without electrical contact with the first and second semiconductor chips 200 and 300. That is, although not illustrated, the first and second trace patterns 122 and 132 may extend in a lateral direction (e.g., x-direction) under the first and second semiconductor chips 200 and 300.

The first semiconductor chip 200 may be disposed adjacent to the second bond finger array 130 on the upper surface 110S1. The first semiconductor chip 200 may include a first chip body portion 210. The first chip body portion 210 may include a plurality of active elements and passive elements for the operation of the first semiconductor chip 200. As an example, the active element may include at least a field effect transistor. As an example, the passive element may include at least a capacitor or a resistor. The active elements and the passive elements may be disposed in an inner region adjacent to the upper surface 210S1 of the first chip body portion 210. The active elements and the passive elements may be connected to each other by wirings to form a semiconductor integrated circuit. Meanwhile, the first chip body portion 210 may be bonded to the upper surface 110S1 of the substrate body portion 110 by a first adhesion layer 410.

A first chip pad array 220 including a plurality of chip pads may be disposed on an upper surface 210S1 of the first chip body portion 210. The first chip pad array 220 may be disposed at a side portion of the upper surface 210S1 and may be disposed in a line along the first direction (i.e., the Y-direction), corresponding to the first bond finger array 120. The specific configuration of the first chip pad array 220 will be described below with reference to FIGS. 2 to 4.

Meanwhile, the second semiconductor chip 300 may be disposed adjacent to the first bond finger array 120 on the upper surface 110S1. The second semiconductor chip 300 may include a second chip body portion 310. The second chip body portion 310 may include a plurality of active elements and passive elements for the operation of the second semiconductor chip 300. The active elements and the passive elements may be disposed in an inner region adjacent to an upper surface 310S1 of the second chip body portion 310. The second chip body portion 310 may be bonded to the upper surface 110S1 of the substrate body portion 110 by a second adhesion layer 420.

A second chip pad array 320 including a plurality of chip pads may be disposed on the upper surface 310S1 of the second chip body portion 310. The second chip pad array 320 may be disposed on one side of the upper surface 310S1 and may be arranged in a line along the first direction (i.e., the Y-direction), corresponding to the second bond finger array 130. The specific configuration of the second chip pad array 320 will be described below with reference to FIGS. 2 to 4.

Referring to FIG. 1, a first bonding wire 701 connecting the bond finger of the first bond finger array 120 disposed on the upper surface 110S1 of the substrate body portion 110 to the chip pad of the first chip pad array 220 disposed on the upper surface 210S1 of the first chip body portion 210 is illustrated. In addition, a second bonding wire 702 connecting the bond finger of the second bond finger array 130 disposed on the upper surface 110S1 of the substrate body portion 110 to the chip pad of the second chip pad array 320 disposed on the upper surface 310S1 of the second chip body portion 310 is illustrated. As described below with reference to FIG. 2, the first bonding wire 701 and the second bonding wire 702 may be staggered with each other along the first direction (i.e., the Y-direction).

Meanwhile, connection pads 160 may be disposed near the lower surface 110S2 of the substrate body portion 110.

As illustrated in FIG. 1, each of the connection pads 160 may be partially embedded in the substrate body portion 110, and one surface of the connection pad 160 may be exposed at the lower surface 110S2. However, the present disclosure is not limited thereto, and in other embodiments not illustrated, the connection pads 160 may be disposed on the lower surface 110S2 of the substrate body portion 110. Connection structures 180 connected to an external system may be disposed on the connection pads 160. Each of the connection structures 180 may include, for example, a solder bump or a solder ball. External power or electrical signals may be input to the connection pads 160 from the external system through the connection structures 180. In addition, a ground potential of an external ground terminal may be provided through the connection structures 180. The external power or the electrical signals input to the connection pads 160 may be transferred to the bond fingers of the first and second bond finger arrays 120 and 130 through the first and second wirings (not illustrated) inside the substrate body portion 110 and the first and second trace patterns 122 and 132 on the substrate body portion 110, respectively. In addition, the ground potential may be provided to the bond fingers of the first and second bond finger arrays 120 and 130. Next, the external power, the electrical signals, and the ground potential may be transferred to the chip pads of the corresponding first and second semiconductor chips 200 and 300 through the first and second bonding wires 701 and 702, respectively, and then, the first and second semiconductor chips 200 and 300 may use the external power and the ground potential or may process the electrical signals.

Figure 2:
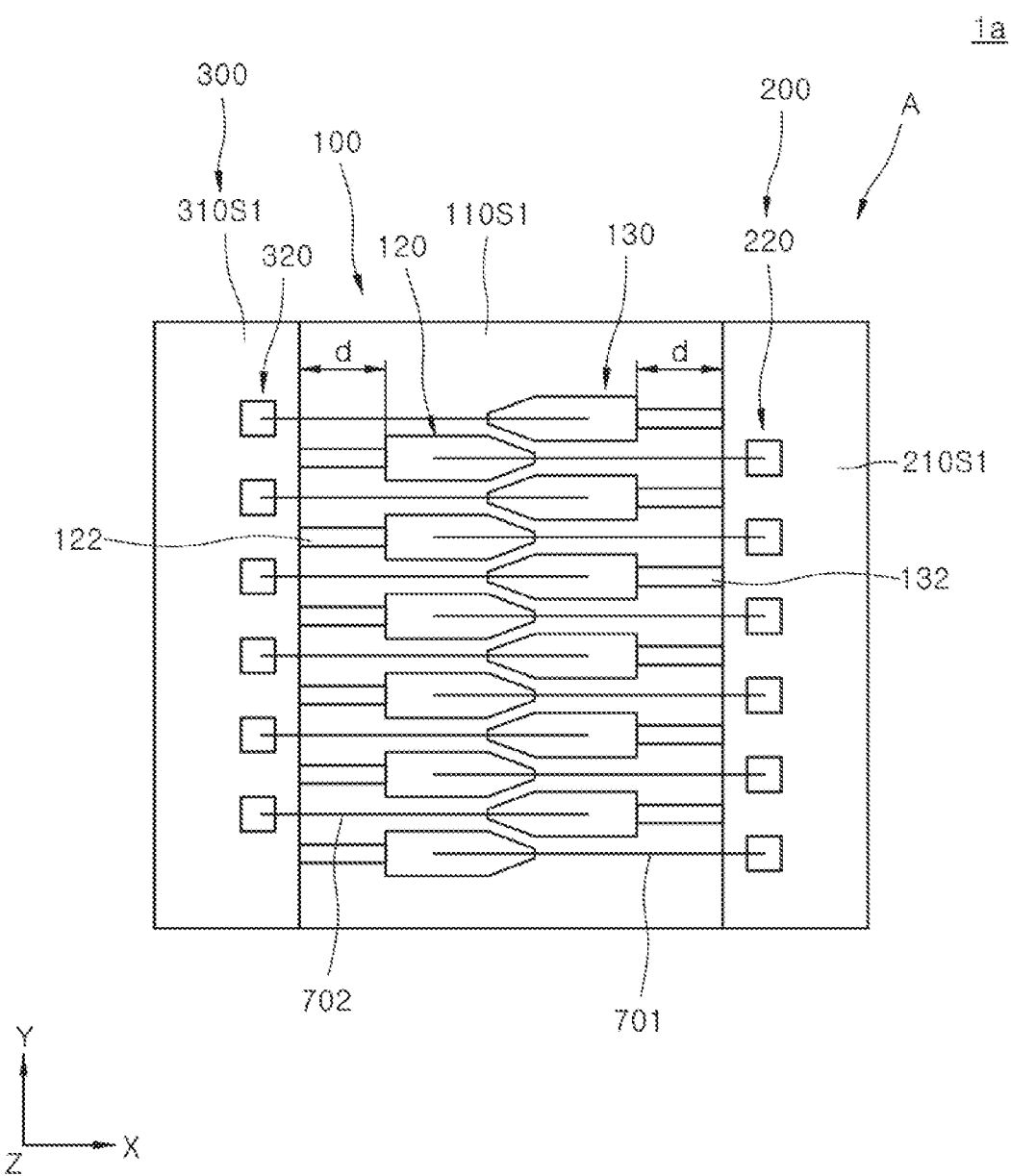
FIGS. 2 and 3 are plan views of a semiconductor package according to an embodiment of the present disclosure.
Figure 3:
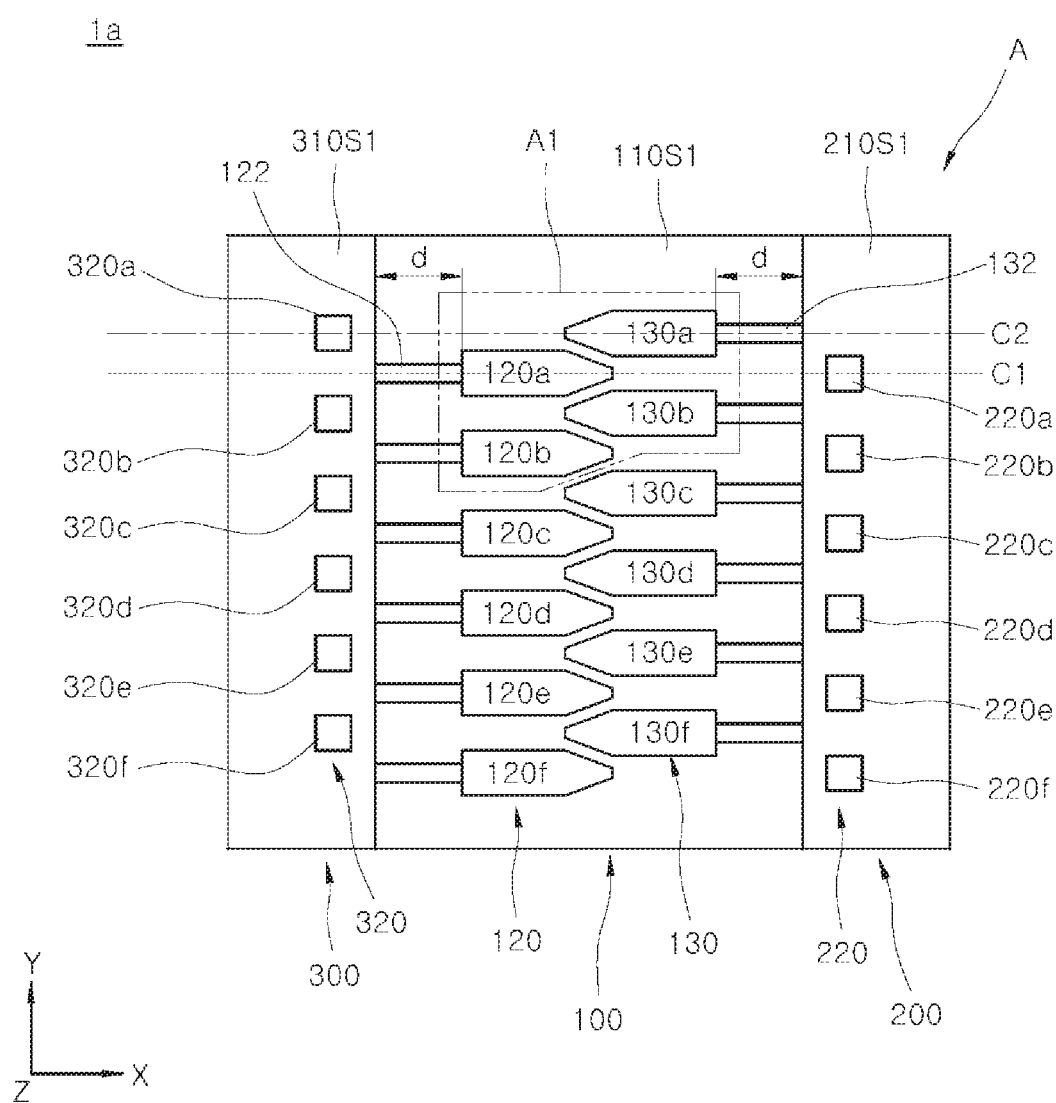
Figure 4:
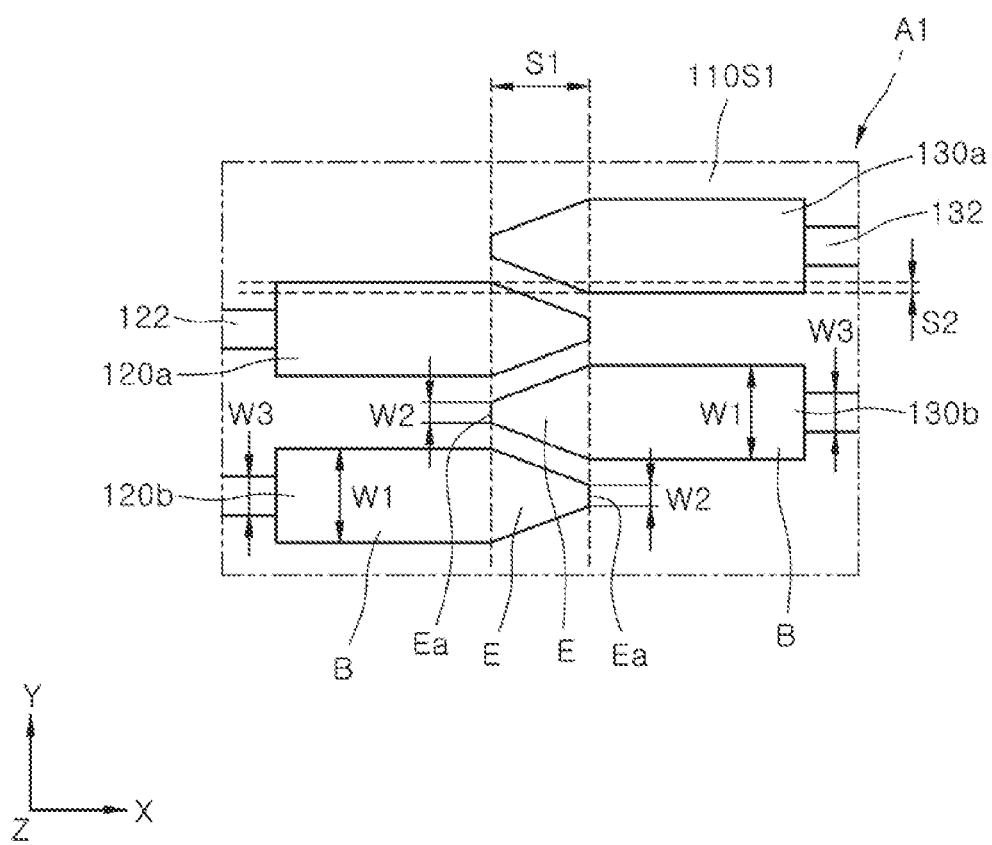
FIG. 4 is an enlarged view of a region A1 of FIG. 3.

FIGS. 2 and 3 are plan views of the semiconductor package 1a according to an embodiment of the present disclosure. Specifically, FIGS. 2 and 3 may be plan views of a region "A" of the semiconductor package 1a of FIG. 1. That is, FIG. 2 is a plan view illustrating the pad arrangement of the region "A" of the semiconductor package of FIG. 1. FIG. 3 is a view in which the first and second bonding wires 701 and 702 are omitted in the plan view of FIG. 2. FIG. 4 is an enlarged view of a region "A1" of FIG. 3. Hereinafter, for convenience, a configuration related to the arrangement of the bond finger array of the package substrate and the chip pad array of semiconductor chips will be described in detail with reference to FIGS. 3 and 4, and then the configuration related to the arrangement of the bonding wires connecting the bond finger array and the chip pad array will be described with reference to FIG. 2.

Referring to FIGS. 3 and 4, first and second bond finger arrays 120 and 130 may be disposed on an upper surface 110S1 of a to substrate body portion 110. The first and second bond finger arrays 120 and 130 may each be arranged in a line along the first direction (i.e., the Y-direction). Referring to FIG. 3, as an embodiment, the first bond finger array 120 may include first to sixth bond fingers 120a, 120b, 120c, 120d, 120e, and 120f spaced apart from each other. In addition, the second bond finger array 130 may include first to sixth bond fingers 130a, 130b, 130c, 130d, 130e, and 130f spaced apart from each other at intervals. Although FIG. 3 illustrates that each of the first and second bond finger arrays 120 and 130 has six bond fingers, the present disclosure is not necessarily limited thereto. In some embodiments, each of the first and second bond finger arrays 120 and 130 may have a different and various numbers of bond fingers.

In an embodiment, each of the first to sixth bond fingers 120a, 120b, 120c, 120d, 120e, and 120f of the first bond finger array 120 may be one of a signal finger, a power finger, and a ground finger. The bond fingers corresponding to the signal finger among the first to sixth bond fingers 120a, 120b, 120c, 120d, 120e, and 120f may be electrically separated from each other. On the other hand, the bond fingers corresponding to the power finger among the first to sixth bond fingers 120a, 120b, 120c, 120d, 120e, and 120f may be electrically connected to each other. Although not illustrated in FIGS. 3 and 4, the electrical connection of the bond fingers corresponding to the power finger may be achieved by the first trace patterns 122 and other wirings of the package substrate 100. Similarly, the bond fingers corresponding to the ground finger among the first to sixth bond fingers 120a, 120b, 120c, 120d, 120e, and 120f may be electrically connected to each other. Although not illustrated in FIGS. 3 and 4, the electrical connection of the bond fingers corresponding to the ground finger may be achieved by the first trace pattern 122 and other wirings of the package substrate 100.

In addition, each of the first to sixth bond fingers 130a, 130b, 130c, 130d, 130e, and 130f of the second bond finger array 130 may be one of a signal finger, a power finger, and a ground finger, respectively. The bond fingers corresponding to the signal finger among the first to sixth bond fingers 130a, 130b, 130c, 130d, 130e, and 130f may be electrically separated from each other. On the other hand, the bond fingers corresponding to the power finger among the first to sixth bond fingers 130a, 130b, 130c, 130d, 130e, and 130f may be electrically connected to each other. Similarly, the bond fingers corresponding to the ground finger among the first to sixth bond fingers 130a, 130b, 130c, 130d, 130e, and 130f may be electrically connected to each other.

Referring to FIGS. 3 and 4, the first to sixth bond fingers 120a, 120b, 120c, 120d, 120e, and 120f of the first bond finger array 120 and the first to sixth bond fingers 130a, 130b, 130c, 130d, 130e, and 130f of the second bond finger array 130 may be arranged to be spaced apart from each other on the upper surface 110S1 of the substrate body portion 110. In addition, the first to sixth bond fingers 120a, 120b, 120c, 120d, 120e, and 120f of the first bond finger array 120 and the first to sixth bond fingers 130a, 130b, 130c, 130d, 130e, and 130f of the second bond finger array 130 may be staggered along the first direction (i.e., the Y-direction). Referring to FIG. 4, as an example, the first bond finger 120a of the first bond finger array 120 may be disposed between the first and second bond fingers 130a and 130b of the second bond finger array 130 along the first direction (i.e., the Y-direction). As another example, the second bond finger 130b of the second bond finger array 130 may be disposed between the first and second bond fingers 120a and 120b of the first bond finger array 120 along the first direction (i.e., the Y-direction). As described in FIG. 3, the remaining bond fingers of the first and second bond finger arrays 120 and 130 may also be disposed on the upper surface 110S1 of the package substrate 100 in the same manner.

In an embodiment, the first to sixth bond fingers 120a, 120b, 120c, 120d, 120e, and 120f of the first bond finger array 120 and the first to sixth bond fingers 130a, 130b, 130c, 130d, 130e, and 130f of the second bond finger array 130 may be arranged to at least partially overlap each other along the first direction (i.e., the Y-direction). Referring to FIG. 4, as an example, the first and second bond fingers 120a and 120b of the first bond finger array 120 and the first and second bond fingers 130a and 130b of the second bond finger array 130 may have overlapping regions within a first distance S1 along the first direction (i.e., the Y-direction) on the upper surface 110S1 of the substrate body portion 110. Similarly, the third to sixth bond fingers 120c, 120d, 120e, and 120f of the first bond finger array 120 and the third to sixth bond fingers 130c, 130d, 130e, and 130f of the second bond finger array 130 shown in FIG. 3 may also have overlapping regions within the same first distance S1 along the first direction (i.e., the Y-direction). In the overlapping regions, the first and second bond fingers 120a, 120b, 120c, 120d, 120e, and 120f of the first bond finger array 120 and the first and second bond fingers 130a, 130b, 130c, 130d, 130e, and 130f of the second bond finger array 130 may face each other along the first direction.

As described above, the first to sixth bond fingers 120a, 120b, 120c, 120d, 120e, and 120f of the first bond finger array 120 and the first to sixth bond fingers 130a, 130b, 130c, 130d, 130e, and 130f of the second bond finger array 130 are arranged to have the overlapping regions along the first direction (i.e., the Y-direction), so that the integration density of the first and second bond finger arrays 120 and 130 with respect to the second direction (i.e., the X-direction) can be improved. That is, the first and second bond finger arrays 120 and 130 are disposed in a denser shape with respect to the second direction (i.e., the X-direction), so that it is possible to save the space for arrangement of the bond fingers of the first and second bond finger arrays 120 and 130 on the upper surface 110S1 of the substrate body portion 110.

In addition, the first to sixth bond fingers 120a, 120b, 120c, 120d, 120e, and 120f of the first bond finger array 120 and the first to sixth bond fingers 130a, 130b, 130c, 130d, 130e, and 130f of the second bond finger array 130 may be arranged to partially overlap each other along the second direction (i.e., the X-direction) perpendicular to the first direction. Referring to FIG. 4, the first bond finger 120a of the first bond finger array 120 and the first bond finger 130a of the second bond finger array 130 may have an overlapping region within a second distance S2 along the second direction (i.e., the X-direction) on the upper surface 110S1 of the substrate body portion 110. Similarly, referring to FIGS. 3 and 4 together, the second to sixth bond fingers 120b, 120c, 120d, 120e, and 120f of the first bond finger array 120 and the second to sixth bond fingers 130b, 130c, 130d, 120e, and 130f of the second bond finger array 130 may also have overlapping regions within the same second distance S2 along the second direction (i.e., the X-direction). In the overlapping regions, the first and second bond fingers 120a, 120b, 120c, 120d, 120e, and 120f of the first bond finger array 120 and the first and second bond fingers 130a, 130b, 130c, 130d, 130e, and 130f of the second bond finger array 130 may face each other along the second direction.

As described above, the first to sixth bond fingers 120a, 120b, 120c, 120d, 120e, and 120f of the first bond finger array 120 and the first to sixth bond fingers 130a, 130b, 130c, 130d, 130e, and 130f of the second bond finger array 130 are arranged to at least partially overlap with each other along the second direction (i.e., the X-direction), so that the integration density of the first and second bond finger arrays 120 and 130 with respect to the first direction (i.e., the V-direction) can be improved. That is, the first and second bond finger arrays 120 and 130 are disposed in a denser form with respect to the first direction (i.e., the V-direction), so that it is possible to save the space for arrangement of the bond fingers on the upper surface 110S1 of the substrate body portion 110.

For some embodiments, as described above with reference to FIG. 4, bond fingers partially overlapping means that regions associated with the bond fingers overlap each other rather than the bond fingers themselves. Similarly, for some embodiments, overlapping portions of band fingers means that regions associated with the portions of bond fingers overlap each other rather than the portions of bond fingers themselves.

Referring to FIGS. 3 and 4 together, each of the first to sixth bond fingers 120a, 120b, 120c, 120d, 120e, and 120f of the first bond finger array 120 may include a finger body portion B and a finger edge portion E. Each of the first to sixth bond fingers 120a, 120b, 120c, 120d, 120e, and 120f may have a substantially uniform width W1 in the finger body portion B. Each of the first to sixth bond fingers 120a, 120b, 120c, 120d, 120e, and 120f may have a width that decreases along the second direction (i.e., the X-direction) in the finger edge portion E. Each of the first to sixth bond fingers 120a, 120b, 120c, 120d, 120e, and 120f may have a minimum width W2 at an end Ea of the finger edge portion E farthest from the finger body portion B. As an example, as illustrated in FIGS. 3 and 4, each of the first to sixth bond fingers 120a, 120b, 120c, 120d, 120e, and 120f may have a hexagonal planar shape on the upper surface 110S1 of the substrate body portion 110.

Similarly, each of the first to sixth bond fingers 130a, 130b, 130c, 130d, 130e, and 130f of the second bond finger array 130 may include a finger body portion B and a finger edge portion E. Each of the first to sixth bond fingers 130a, 130b, 130c, 130d, 130e, and 130f may have a substantially uniform width W1 in the finger body portion B. Each of the first to sixth bond fingers 130a, 130b, 130c, 130d, 130e, and 130f may have a width that decreases along the second direction (i.e., the X-direction) in the finger edge portion E, Each of the first to sixth bond fingers 130a, 130b, 130c, 130d, 130e, and 130f may have a minimum width W2 at an end Ea of the finger edge portion E farthest from the finger body portion B. As an example, as illustrated in FIGS. 3 and 4, each of the first to sixth bond fingers 130a, 130b, 130c, 130d, 130e, and 130f may have a hexagonal planar shape on the upper surface 110S1 of the substrate body portion 110.

Referring to FIGS. 3 and 4, the overlap along the first direction (i.e., the Y-direction) between the bond fingers 120a, 120b, 120c, 120d, 120e, and 120f of the first bond finger array 120 and the bond fingers 130a, 130b, 130c, 130d, 130e, and 130f of the second bond finger array 130 may be the overlap between the edge portions E of the bond fingers 120a, 120b, 120c, 120d, 120e, and 120f and the bond fingers 130a, 130b, 130c, 130d, 130e, and 130f.

Referring to FIGS. 3 and 4 together, the finger edge portions E of the first to sixth bond fingers 120a, 120b, 120c, 120d, 120e, and 120f of the first bond finger array 120 may be disposed to face the corresponding chip pads 220a, 220b, 220c, 220d, 220e, and 220f of the first chip pad array 220. The finger edge portions E of the first to sixth bond fingers 130a, 130b, 130c, 130d, 130e, and 130f of the second bond finger array 130 may be disposed to face the corresponding chip pads 320a, 320b, 320c, 320d, 320e, and 320f of the second chip pad array 320.

As an example, a first extension line C1 passes through the central axis of the first bond finger 120a of the first bond finger array 120 and extends in the second direction (i.e., the X-direction). The first extension line C1 may meet the first chip pad 220a of the first chip pad array 220. Although not illustrated in FIGS. 3 and 4, a plurality of extension lines, each passing through the central axes of the second to sixth bond fingers 120b, 120c, 120d, 120e, and 120f of the first bond finger array 120 and extending in the second direction (i.e., the X-direction) may be provided. Each of the plurality of the extension lines meets the corresponding second to sixth chip pads 220b, 220c, 220d, 220e, and 220f of the first chip pad array 220. The plurality of extension lines extending through the central axes of the second to sixth bond fingers 120b, 120c, 120d, 120e, and 120f of the first bond finger array 120 may be parallel to the first extension line C1 extending in the second direction (i.e., the X-direction) through the central axis of the first bond finger 120a.

As another example, a second extension line C2 passes through the central axis of the first bond finger 130a of the second bond finger array 130 and extends in the second direction (i.e., the X-direction). The second extension line C2 may meet the first chip pad 320a of the second chip pad array 320. Although not illustrated in FIGS. 3 and 4, a plurality of extension lines extending in the second direction (i.e., the X-direction) through the central axes of the second to sixth bond fingers 130b, 130c, 130d, 130e, and 130f of the second bond finger array 130 may be provided. Each of the plurality of the extension lines meets the corresponding second to sixth chip pads 320b, 320c, 320d, 320e, and 320f of the second chip pad array 320. The plurality of extension lines extending through the central axes of the second to sixth bond fingers 130b, 130c, 130d, 130e, and 130f of the second bond finger array 130 may be parallel to the second extension line C2 extending in the second direction (i.e., the X-direction) through the central axis of the first bond finger 130a.

Meanwhile, the first extension line C1 and the second extension line C2 may be parallel to each other. Therefore, the plurality of extension lines parallel to the first extension line C1, and the plurality of extension lines parallel to the second extension line C2 may be parallel to each other. Accordingly, as illustrated in FIG. 2, it is possible to effectively arrange the first and second bonding wires 701 and 702 to prevent electrical short circuits between each other when forming the first and second bonding wires 701 and 702. That is, the first bonding wires 701 and the second bonding wires 702 may be alternately arranged to be spaced apart from each other at a distance along the first direction (i.e., the Y-direction).

In addition, when the first extension line C1, the second extension line C2 and other extension lines are formed parallel to each other, defects occurring in the process of connecting the chip pads and the bond fingers with bonding wires can be mitigated or suppressed. Specifically, the wire bonding may be formed using a wire bonding capillary. The shape of the wire bonding or connection path may be adjusted using the movement of the wire bonding capillary. When the bonding wires connecting the chip pad and the bond fingers are parallel to each other, the movement paths of the wire bonding capillaries for connecting the bonding wires may be maintained parallel to each other. Accordingly, connection process can be made without the wire bonding capillary contacting other adjacent bonding wires. In other words, it is possible to mitigate or prevent deformation or damage to adjacent bonding wires due to the movement of the wire bonding capillary in the wire bonding process.

Referring to FIGS. 3 and 4 together, the first and second trace patterns 122 and 132 may be disposed on the upper surface 110S1 of the substrate body portion 110. The first trace patterns 122 may extend in a direction of the second semiconductor chip 300 from the finger body portions B of the first to sixth bond fingers 120a, 120b, 120c, 120d, 120e, and 120f. The width W3 of the first trace patterns 122 in FIG. 4 may be less than the width W1 of the finger body portion B. Although not specifically illustrated, the first trace patterns 122 may extend to the lower portion of the second semiconductor chip 300 and may be electrically connected to the first wirings of the package substrate 100. As an example, the first wirings may include outer layer circuit patterns, inner layer circuit patterns, and vias of the package substrate 100. The first trace patterns 122 may be electrically connected to the corresponding connection pads 160 in the package substrate 100 illustrated in FIG. 1 through the first wirings such as vias. Accordingly, external signals and external power input to the connection pads 160 through the connection structures 180 may be transferred to the first to sixth bond fingers 120a, 120b, 120c, 120d, 120e, and 120f of the first bond finger array 120.

Similarly, the second trace patterns 132 may extend in a direction of the first semiconductor chip 200 from the finger body portions B of the first to sixth bond fingers 130a, 130b, 130c, 130d, 130e, and 130f. The width W3 of the second trace patterns 132 in FIG. 4 may be less than the width W1 of the finger body portion B. Although not specifically illustrated, the second trace patterns 132 may extend to the lower portion of the first semiconductor chip 200 and may be electrically connected to the second wirings of the package substrate 100. The second trace patterns 132 may be electrically connected to the corresponding connection pads 160 in the package substrate 100 illustrated in FIG. 1 through the second wirings such as vias. Accordingly, external signals and external power input to the connection pads 160 through the connection structures 180 may be transferred to the first to sixth bond fingers 130a, 130b, 130c, 130d, 130e, and 130f of the second bond finger array 130.

Referring to FIG. 3, the first semiconductor chip 200 may be disposed closer to the second bond finger array 130 than the first bond finger array 120 on the upper surface 110S1. The first to sixth bond fingers 130a, 130b, 130c, 130d, 130e, and 130f of the second bond finger array 130 may be spaced apart from the first semiconductor chip 200 at a distance d. Also, the second semiconductor chip 300 may be disposed closer to the first bond finger array 120 than the second bond finger array 130. The first to sixth bond fingers 120a, 120b, 120c, 120d, 120e, and 120f of the first bond finger array 120 may be spaced apart from the second semiconductor chip 300 at a distance d.

Referring to FIGS. 2 to 4 together, the first bonding wires 701 may connect the first to sixth bond fingers 120a, 120b, 120c, 120d, 120e, and 120f of the first bond finger array 120 to the corresponding first to sixth chip pads 220a, 220b, 220c, 220d, 220e, and 220f of the first chip pad array 220. In addition, the second bonding wires 702 may connect the first to sixth bond fingers 130a, 130b, 130c, 130d, 130e, and 130f of the second bond finger array 130 to the corresponding first to sixth chip pads 320a, 320b, 320c, 320d, 320e, and 320f of the second chip pad array 320.

The first to sixth chip pads 220a, 220b, 220c, 220d, 220e, and 220f of the first semiconductor chip 200 may be connected to the corresponding first to sixth bond fingers 120a, 120b, 120c, 120d, 120e, and 120f of the first bond finger array 120 by the first bonding wires 701. The first bond finger array 120 is located farther from the first semiconductor chip 200 than the second bond finger array 130. In addition, the first to sixth chip pads 320a, 320b, 320c, 320d, 320e, and 320f of the second semiconductor chip 300 may be connected to the corresponding first to sixth bond fingers 130a, 130b, 130c, 130d, 130e, and 130f of the second bond finger array 130 by the second bonding wires 702. The second bond finger array 130 is located farther from the second semiconductor chip 300 than the first bond finger array 120.

In an embodiment, the first and second bonding wires 701 and 702 may be formed as follows with reference to FIGS. 2 and 3. First, one end of the bonding wire is bonded to the first chip pad 320a of the second semiconductor chip 300 using a wire bonding capillary. Subsequently, the second bonding wire 702 is formed by moving the wire bonding capillary to bond the other end of the bonding wire to the first bond finger 130a of the second bond finger array 130. Finally, the bonding wire is disconnected from the second bonding wires 702. At this time, the first bond finger 130a is disposed sufficiently spaced from the first semiconductor chip 200 at a distance d, so that the wire bonding capillary does not contact the semiconductor chip and can form a loop shape of the bonding wire. In order to form the first bonding wire 701, the wire bonding capillary is moved to the first chip pad 220a of the first semiconductor chip 200. One end of the bonding wire is bonded to the first chip pad 220a of the first semiconductor chip 200. Subsequently, the first bonding wire 701 is formed by moving the wire bonding capillary to bond the other end of the bonding wire to the first bond finger 120a of the first bond finger array 120. Finally, the bonding wire is disconnected from the first bonding wire 701. At this time, the first bond finger 120a is disposed sufficiently spaced from the second semiconductor chip 300 at a distance d, so that the wire bonding capillary does not contact the semiconductor chip and can form a loop shape of the bonding wire. In the same manner, the second bonding wires 702 and the first bonding wires 701 may be alternately formed along the first direction (i.e., the Y-direction).

Meanwhile, as described above with reference to FIG. 3, a plurality of extension lines extending through the central axes of the first to sixth bond fingers 120a, 120b, 120c, 120d, 120e, and 120f, and a plurality of extension lines extending through the central axes of the first to sixth bond fingers 130a, 130b, 130c, 130d, 130e, and 130f may be parallel to each other. Accordingly, the first and second bonding wires 701 and 702 may be staggered with each other along the first direction (i.e., the Y-direction) in a state in which electrical short circuits are mitigated or prevented. In addition, as described above, it is possible to mitigate or prevent deformation or damage to adjacent bonding wires due to the movement of the wire bonding capillary in the wire bonding process.

Figure 5:
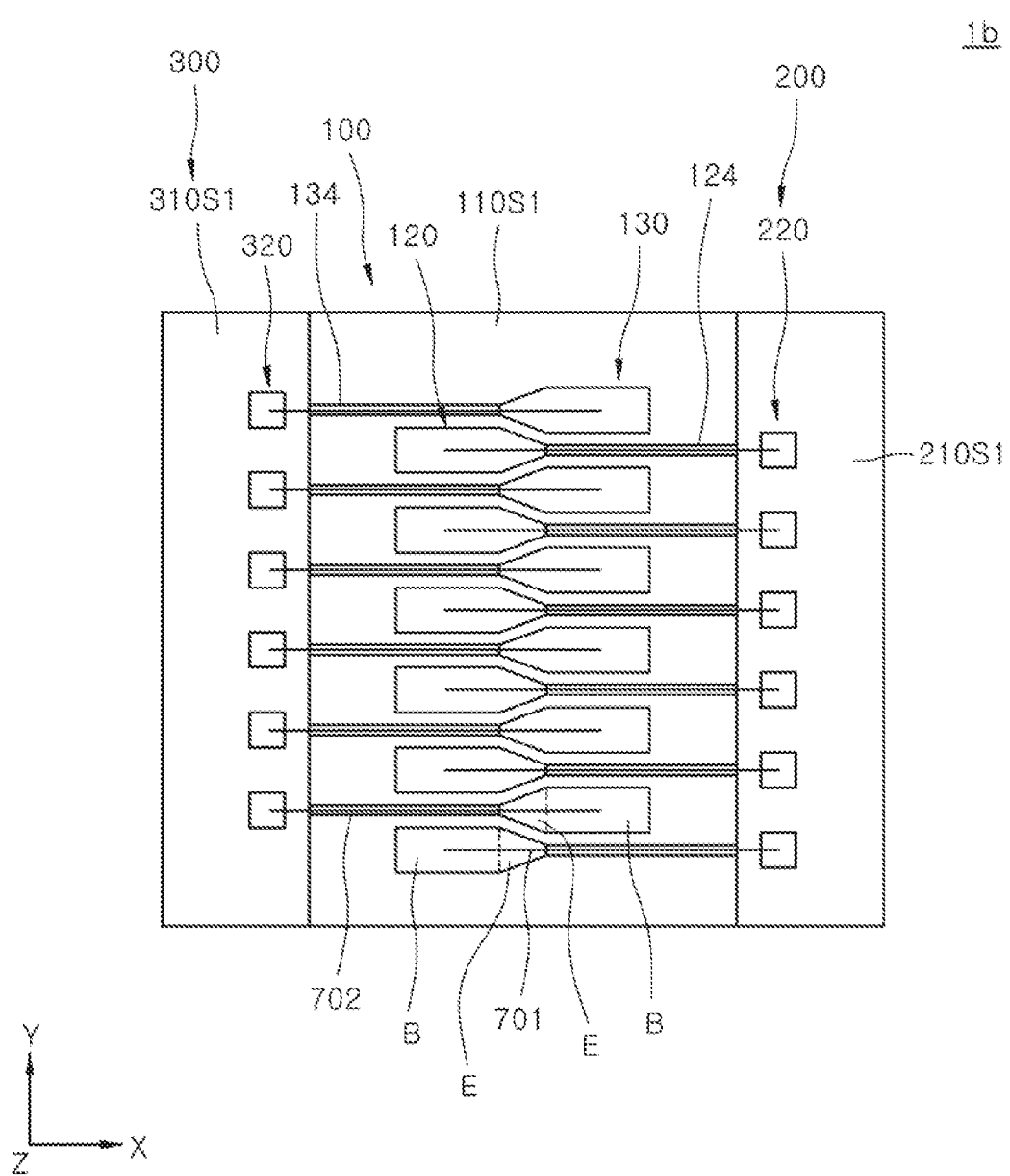
FIG. 5 is a plan view of a semiconductor package according to another embodiment of the present disclosure.

FIG. 5 is a plan view of a semiconductor package 1b according to another embodiment of the present disclosure. FIG. 5 may illustrate a modification of the first and second trace patterns 122 and 132 disposed on the package substrate 100 of the semiconductor package 1a described above with reference to FIGS. 1 to 4. The semiconductor package 1b shown in FIG. 5 may have substantially the same configuration as the semiconductor package 1a described above with reference to FIGS. 1 to 4, except for first and second trace patterns 124 and 134.

Referring to FIG. 5, the first trace patterns 124 of this embodiment may extend from the finger edge portions E of the bond fingers of the first bond finger array 120 toward the first semiconductor chip 200. Although not illustrated, the first trace patterns 124 may extend to the lower portion of the first semiconductor chip 200 and may be electrically connected to the first wirings of the package substrate 100. The first trace patterns 124 may be electrically connected to the corresponding connection pads 160 of the package substrate 100 shown in FIG. 1 through the first wirings such as vias. Through this, the bond fingers of the first bond finger array 120 respectively corresponding to the signal finger, the power finger, and the ground finger can receive external signals, external power, and external ground potential input through the connection pads 160.

Similarly, the second trace patterns 134 may extend from the finger edge portions E of the bond fingers of the second bond finger array 130 toward the second semiconductor chip 300. The second trace patterns 134 may extend to the lower portion of the second semiconductor chip 300 and may be electrically connected to the second wirings of the package substrate 100. The second trace patterns 134 may be electrically connected to the corresponding connection pads 160 of the package substrate 100 illustrated in FIG. 1 through the second wirings such as vias. Through this, the bond fingers of the second bond finger array 130 can receive external signals and external power input through the connection pad 160, and may be connected to an external ground terminal through the connection pads 160.

As described above, semiconductor packages according to some embodiments of the present disclosure include first and second bond finger arrays wire-bonded with different semiconductor chips on a package substrate, respectively. The first and second bond finger arrays may be respectively arranged in a line along the first direction. The bond fingers of the first bond finger array and the bond fingers of the second bond finger array are disposed to overlap at least partially with each other along the first direction and a second direction perpendicular to the first direction. Therefore, the integration degree of the bond fingers in the first direction and the second direction on the package substrate can be improved. As a result, efficient arrangement of the first and second bond finger arrays on the package substrate is possible. In addition, by saving the arrangement space of the first and second bond finger arrays, the degree of freedom of design for various other patterns implemented on the package substrate can be improved.

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A semiconductor package comprising:
a package substrate including first and second bond finger arrays, each of the first and second bond finger arrays arranged in a first direction on a surface of the package substrate;
a first semiconductor chip disposed on the surface of the package substrate and including a first chip pad array corresponding to the first bond finger array;
a second semiconductor chip disposed on the surface of the package substrate and including a second chip pad array corresponding to the second bond finger array;
first bonding wires connecting bond fingers of the first bond finger array to chip pads of the first chip pad array; and
second bonding wires connecting bond fingers of the second bond finger array to chip pads of the second chip pad array,
wherein the bond fingers of the first bond finger array and the bond fingers of the second bond finger array at least partially overlap with each other along the first direction,
wherein each of the bond fingers of the first and second bond finger arrays comprises:
a finger body portion having a substantially uniform width along a second direction perpendicular to the first direction; and
a finger edge portion having a width that decreases along the second direction.

2. The semiconductor package of claim 1, wherein the bond fingers of the first bond finger array and the bond fingers of the second bond finger array at least partially overlap with each other along a second direction perpendicular to the first direction.

3. The semiconductor package of claim 1, wherein each of the bond fingers of the first and second bond finger arrays has a minimum width at an end of the finger edge portion farthest from the finger body portion.

4. The semiconductor package of claim 1, wherein each of the bond fingers of the first and second bond finger arrays has a hexagonal planar shape on the surface of the package substrate.

5. The semiconductor package of claim 1, wherein the finger edge portions of the first bond finger array and the finger edge portions of the second bond finger array overlap with each other along the first direction.

6. The semiconductor package of claim 1,
wherein the finger edge portions of the first bond finger array are disposed to face the chip pads of the first chip pad array, and
wherein the finger edge portions of the second bond finger array are disposed to face the chip pads of the second chip pad array.

7. The semiconductor package of claim 1, further comprising:
first trace patterns extending from the bond fingers of the first bond finger array on the surface of the package substrate, the first trace patterns electrically connected to first wirings of the package substrate; and
second trace patterns extending from the bond fingers of the second bond finger array on the surface of the package substrate, the second trace patterns electrically connected to second wirings of the package substrate on the surface.

8. The semiconductor package of claim 1,
wherein the first semiconductor chip is disposed closer to the second bond finger array than the first bond finger array, and
wherein the second semiconductor chip is disposed closer to the first bond finger array than the second bond finger array.

9. The semiconductor package of claim 1,
wherein the bond fingers of the first bond finger array are spaced apart from the second semiconductor chip, and
wherein the bond fingers of the second bond finger array are spaced apart from the first semiconductor chip.

10. The semiconductor package of claim 1,
wherein first extension lines passing through central axes of the bond fingers of the first bond finger array and extending in the second direction perpendicular to the first direction are disposed to meet chip pads in the first chip pad array of the first semiconductor chip,
wherein second extension lines passing through central axes of the bond fingers of the second bond finger array and extending in the second direction are disposed to meet chip pads in the second chip pad array of the second semiconductor chip, and
wherein the first extension lines and the second extension lines are parallel to each other.

11. The semiconductor package of claim 7,
wherein the first trace patterns extend from the finger body portions of the first bond finger array toward the second semiconductor chip, and
wherein the second trace patterns extend from the finger body portions of the second bond finger array toward the first semiconductor chip.

12. The semiconductor package of claim 7,
wherein the first trace patterns extend from the finger edge portions of the first bond finger array toward the first semiconductor chip, and
the second trace patterns extend from the finger edge portions of the second bond finger array toward the second semiconductor chip.

13. A semiconductor package comprising:
a package substrate including first and second bond finger arrays, the first and second bond finger arrays arranged along first and second lines, respectively, in a first direction on a surface of the package substrate;
a first semiconductor chip including a first chip pad array corresponding to the first bond finger array and disposed, on the surface of the package substrate, closer to the second bond finger array than the first bond finger array;
a second semiconductor chip including a second chip pad array corresponding to the second bond finger array and disposed, on the surface of the package substrate, closer to the first bond finger array than the second bond finger array, and;
first bonding wires connecting bond fingers of the first bond finger array to chip pads of the first chip pad array;
second bonding wires connecting bond fingers of the second bond finger array to chip pads of the second chip pad array;
first trace patterns extending from the bond fingers of the first bond finger array on the substrate, the first trace patterns electrically connecting the bond fingers of the first bond finger array to first wirings of the package substrate; and
second trace patterns extending from the bond fingers of the second bond finger array on the substrate, the second trace patterns electrically connecting the bond fingers of the second bond finger array to second wirings of the package substrate,
wherein the bond fingers of the first bond finger array and the bond fingers of the second bond finger array are staggered along the first direction,
wherein each of the bond fingers of the first and second bond finger arrays comprises:
a finger body portion having a substantially uniform width along a second direction perpendicular to the first direction; and
a finger edge portion having a width that decreases along the second direction.

14. The semiconductor package of claim 13,
wherein the finger edge portions of the first bond finger array are disposed to face the chip pads of the first chip pad array, and
wherein the finger edge portions of the second bond finger array are disposed to face the chip pads of the second chip pad array.

15. The semiconductor package of claim 13,
wherein the first trace patterns extend from the finger body portions of the first bond finger array toward the second semiconductor chip, and
wherein the second trace patterns extend from the finger body portions of the second bond finger array toward the first semiconductor chip.

16. The semiconductor package of claim 13,
wherein the bond fingers of the first bond finger array are spaced apart from the second semiconductor chip, and
wherein the bond fingers of the second bond finger array are spaced apart from the first semiconductor chip.

17. The semiconductor package of claim 13,
wherein first extension lines passing through central axes of the bond fingers of the first bond finger array and extending in the second direction perpendicular to the first direction are disposed to meet chip pads in the first chip pad array of the first semiconductor chip,
wherein second extension lines passing through the central axes of the bond fingers of the second bond finger array and extending in the second direction are disposed to meet chip pads in the second chip pad array of the second semiconductor chip, and
wherein the first extension lines and the second extension lines are parallel to each other.

18. The semiconductor package of claim 14, wherein the finger edge portions of the first and second bond finger arrays overlap with each other along the first direction.

* * * * *